(12) United States Patent
Nguyen et al.

(10) Patent No.: US 6,178,526 B1
(45) Date of Patent: Jan. 23, 2001

(54) TESTING MEMORY MODULES WITH A PC MOTHERBOARD ATTACHED TO A MEMORY-MODULE HANDLER BY A SOLDER-SIDE ADAPTOR BOARD

(75) Inventors: Thang Nguyen, Santa Ana; Ngoc Le, Mission Viejo; Benjamin E. Chou, Irvine, all of CA (US)

(73) Assignee: Kingston Technology Company, Fountain Valley, CA (US)

( * ) Notice: Under 35 U.S.C. 154(b), the term of this patent shall be extended for 0 days.

(21) Appl. No.: 09/056,973

(22) Filed: Apr. 8, 1998

(51) Int. Cl.[7] .......................... H02H 3/05; H03K 19/003
(52) U.S. Cl. .............................. 714/42; 714/718
(58) Field of Search ................... 714/42, 29, 54, 714/718, 30, 767; 711/115, 170, 173; 710/102, 103

(56) References Cited

U.S. PATENT DOCUMENTS

| | | |
|---|---|---|
| 4,992,850 * | 2/1991 | Corbett et al. ........................ 257/203 |
| 5,184,068 | 2/1993 | Twigg et al. ........................... 324/158 |
| 5,224,023 | 6/1993 | Smith et al. ........................... 361/412 |
| 5,228,039 | 7/1993 | Knoke et al. .......................... 371/19 |
| 5,301,343 * | 4/1994 | Alvarez ................................. 711/170 |
| 5,357,519 | 10/1994 | Martin et al. ......................... 371/15.1 |
| 5,423,028 | 6/1995 | Schieve et al. ....................... 395/575 |
| 5,450,576 | 9/1995 | Kennedy ............................... 395/650 |
| 5,519,832 | 5/1996 | Warchol ........................... 395/183.22 |
| 5,533,194 | 7/1996 | Albin et al. ...................... 395/183.18 |
| 5,581,712 | 12/1996 | Herrman .............................. 395/283 |
| 5,611,436 | 3/1997 | Ashby ................................... 209/573 |
| 5,655,083 | 8/1997 | Bagley ............................. 395/182.31 |
| 5,655,106 | 8/1997 | Smith .................................... 395/500 |
| 5,704,489 * | 1/1998 | Smith ...................................... 209/2 |
| 5,706,300 | 1/1998 | Wedel ................................. 371/22.1 |
| 5,852,617 * | 12/1998 | Mote, Jr. ............................... 714/726 |
| 5,862,320 * | 1/1999 | Nelson et al. ................... 395/183.18 |
| 6,046,421 * | 4/2000 | Ho ........................................ 209/573 |
| 6,092,146 * | 7/2000 | Dell et al. ................................ 711/5 |

* cited by examiner

Primary Examiner—Dieu-Minh T. Le
(74) Attorney, Agent, or Firm—Stuart T. Auvinen (57) ABSTRACT

Memory modules such as SIMMs and DIMMs are automatically tested by a target-system motherboard such as a PC motherboard. An automated SIMM/DIMM handler is connected to a handler adaptor board that is mounted to the back or solder-side of the PC motherboard. The relatively flat surface of the solder-side of the PC motherboard allows close mounting of the handler. One or more of the SIMM sockets on the motherboard is removed to provide mounting holes for the handler adaptor board. The handler adaptor board provides electrical connection from the module-under-test (MUT) in the handler to the removed SIMM socket on the PC motherboard. The handler adaptor board provides a slight spacing or offset from the solder-side surface of the PC motherboard's substrate, allowing the handler to be plugged directly into tester-connectors on the handler adaptor board. Since the offset of the adaptor board is slight, the length of electrical connections to the handler is short, minimizing the load on the PC's memory bus. A handler controller card that controls the handler is plugged into the PCI or ISA bus on the PC motherboard. Power to the handler adaptor board is cut when a new module is moved into position in the handler, reducing memory-bus upset.

20 Claims, 8 Drawing Sheets

FIG. 1

PRIOR ART

FIG. 2

PRIOR ART

TESTING MEMORY MODULES WITH A PC MOTHERBOARD ATTACHED TO A MEMORY-MODULE HANDLER BY A SOLDER-SIDE ADAPTOR BOARD

FIELD OF THE INVENTION

This invention relates to electronic test systems, and more particularly to testers for memory modules including SIMMs and DIMMs.

BACKGROUND OF THE INVENTION

Most personal computers (PCs) use DRAM memory chips mounted on small, removable memory modules. Originally produced as single-inline memory modules (SIMMs) with memory organized into sizes such as 256K×9 and 1M×9, more recent memory modules use wider I/O. Thus 4M×32 modules are commonplace today. Additional I/O is facilitated by using dual-inline memory modules (DIMMs), such as 168-pin modules.

Huge demand for memory modules has resulted in an extremely crowded and competitive industry that is very cost sensitive. Testing costs are significant, especially for higher-density modules that have more memory locations that must be tested. Specialized, high-speed electronic test equipment is expensive, and the greater number of memory cells on high-speed memory modules increases the time spent on the tester, increasing costs.

Handlers for integrated circuits (ICs) have been used for many years in the semiconductor industry. These handlers accept a stack of IC chips that are fed, one at a time, to the tester. Once tested, the IC is sorted into a "bin" another stack of IC chips that have either passed or failed the test. ICs from good bins are packaged for sale, while ICs from bad bins are thrown out. Bins can be set up for different types of failures (open circuit, short circuit, functional failures, out-of-spec parameters, etc.) and statistics kept for analysis by engineers.

Figure 1:
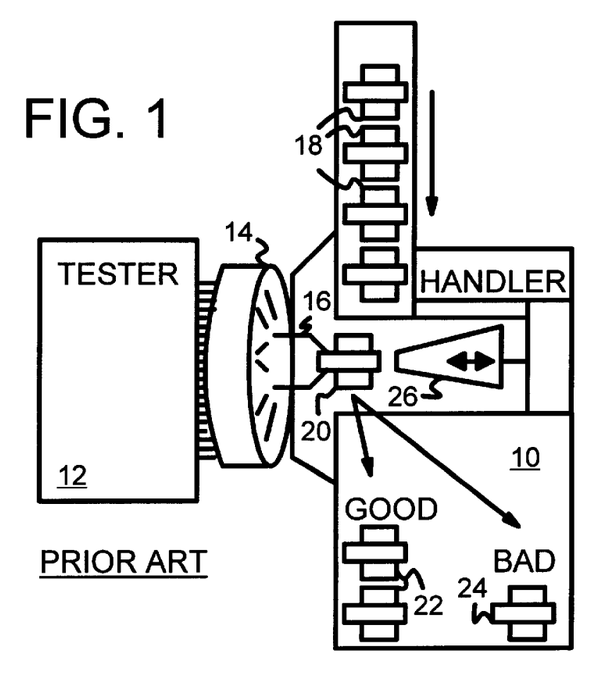
FIG. 1 shows a SIMM handler connected to a high-speed electronic tester.

More recently, handlers have been made for memory modules. U.S. Pat. No. 5,704,489 by Smith, describes in detail a "SIMM/DIMM Board Handler" such as those in use today. FIG. 1 shows a SIMM handler connected to a high-speed electronic tester. Handler 10 is of the type described by Smith. Memory modules 18 to be tested are loaded into the top of handler 18 in the input stack. Memory modules 18 as shown have DRAM chips surface-mounted to both sides of the substrate, as is well-known in the art. These modules 18 drop down, one-by-one, into testing area. Module-under test MUT 20 is next to be tested. Arm 26 pushes MUT 20 laterally until it makes contact with contactor pins 16 that clamp down on "leadless" connector pads formed on the substrate of MUT 20.

Pins 16 thus make electrical contact with the 168 leadless contact pads of memory-module MUT 20. Contactor pins 16 are also connected to test head 14, which makes connection to tester 12. Tester 12 executes parametric and functional test programs that determine when MUT 20 falls within specified A.C. and D.C. parameters, and whether all memory bit locations can have both a zero and a one written and read back. Shorts between adjacent memory bits cable detected by performing tests using various test patterns, such as walking-ones, walking zeros, and checkerboard.

Tester 12 can cost from ten-thousand to millions of dollars. Cost can be reduced if a less-expensive tester replaces tester 12. Since most memory modules are intended for installation on PCs, some manufacturers test memory modules simply by plugging them into SIMM or DIMM sockets on PC motherboards. A test program is then executed on the PC, testing the inserted module. Since PCs cost only about a thousand dollars, tester 12 and handler 10 of FIG. 1 are replaced by a low-cost PC. Equipment costs are thus reduced by a factor of a hundred.

Figure 2:
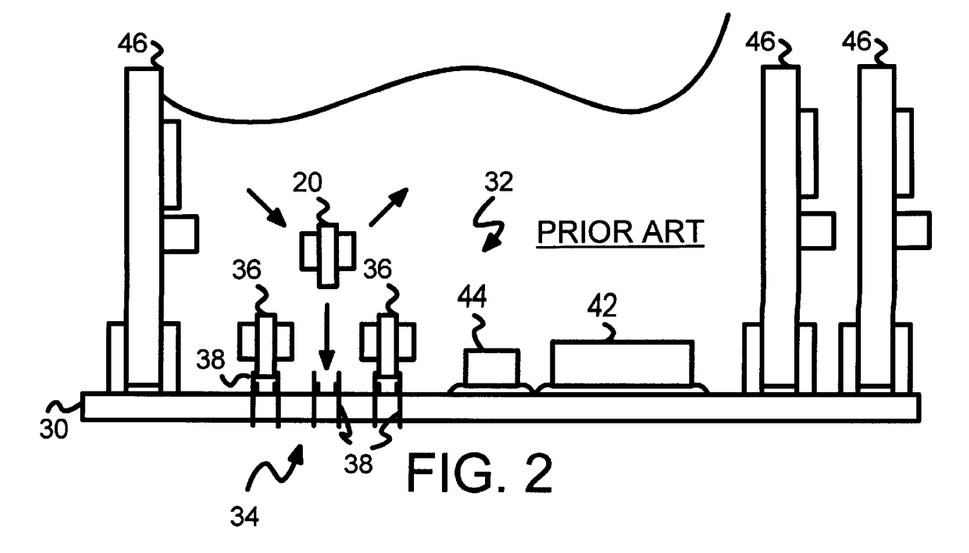
FIG. 2 shows a PC motherboard being used to manually test memory modules.

FIG. 2 shows a PC motherboard being used to manually test memory modules. Substrate 30 is a glass-epoxy motherboard having multiple layers of patterned conductor traces sandwiched between insulating layers, as is well-known in the art. Components 42, 44 are mounted on the top side of substrate 30, such as by wave-soldering. Components 42, 44 include ICs such as a microprocessor, logic chips, buffers, and peripheral controllers. Components 42, 44 may be directly mounted onto the top surface, or may have pins that are fitted into holes in the substrate. These pins are then soldered to the backside of substrate 30. Sockets for expansion cards 46 are also mounted onto the top or component side of substrate 30, while their pins are placed through holes in substrate 30 and soldered to the back side of substrate 30. Some of components 42, 44 may also be mounted in sockets.

Memory modules 36 are SIMM or DIMM modules that fit into SIMM/DIMM sockets 38. SIMM/DIMM sockets 38 (hereinafter SIMM sockets 38) have metal pins that fit through holes in substrate 30. These pins are soldered to solder-side 34 of substrate 30 to rigidly attach SIMM sockets to the PC motherboard. Both electrical connection and mechanical support are provided by SIMM sockets 38.

While using PC motherboards for testing memory modules greatly reduces equipment costs, labor costs are increased. Memory modules must be inserted and removed manually. Manual insertion and removal of memory modules is slow and labor-intensive. It also wears the leadless contact pads on the modules, which can give the appearance that the modules is used rather than new.

While it is desirable to use a SIMM/DIMM handler to insert and remove memory modules for test, expansion cards 46 and cables 48 can block access to SIMM socket 38. Thus the crowded area around SIMM socket 38 on the PC motherboard prevents putting a handler in close proximity to the SIMM socket. A person must reach in with his hands and manually insert SIMM 20 into SIMM socket 38.

Connecting a handler to SIMM socket 38 using a long cable is possible, since the long cable allows the handler to be farther away from the crowded PC motherboard. However, the long cable is not desirable since it adds significant loading to the PC's memory bus. This loading slows the memory operation down, resulting in test failures for good memory modules. Interference can also be inserted into the memory bus by the long cable.

What is desired is a low-cost test apparatus for testing memory modules. It is desired to reduce testing costs by eliminating the expensive electronic tester. It is desired to use a PC motherboard or other target-system board to test the memory modules. It is further desired to use a SIMM/DIMM handler to automatically insert and remove memory modules that are tested by a PC motherboard. It is desired to connect the handler to a PC motherboard without a long cable so that the loading on the PC's memory bus is minimized, allowing full-speed testing.

SUMMARY OF THE INVENTION

An automated test apparatus tests high-speed memory modules using a memory-module handler. A target-system motherboard has components including a microprocessor, memory, and expansion-bus connectors mounted on a component-side of the target-system motherboard. The memory includes memory modules inserted into memory-module sockets mounted on the component-side.

A handler adaptor board has adaptor pins protruding out a first side and has connector sockets mounted on a second side opposite the first side. At least one of the memory-module sockets has been removed. The adaptor pins connect to the target-system motherboard on a solder-side of the target-system motherboard immediately opposite a location where the at least one memory-module sockets have been removed.

The connector sockets on the handler adaptor board connect to the memory-module handler. They connect signals from a memory module under test in the memory-module handler to a memory bus on the target-system motherboard. Thus the memory module under test in the memory-module handler is electrically connected to the target-system motherboard.

In further aspects of the invention a handler controller card is inserted into one of the expansion-bus connectors. The handler controller card communicates with the memory-module handler when the memory-module under test in the memory-module handler is tested by the target-system motherboard. Thus the memory-module handler is controlled by the target-system motherboard.

In still further aspects the handler controller card has a sorting means that is coupled to the memory-module handler through a handler cable. It sends a sort signal to the memory-module handler at a completion of tests of the memory-module under test. The sort signal instructs the memory-module handler to sort the memory-module under test into either a good bin or functional memory modules or into a bad bin of faulty memory modules. A ready signal from the memory-module handler indicates when the memory-module handler has moved a new memory-module to a test position.

In other aspects the handler controller card has a flash memory means that stores a test program. The test program tests the memory-module under test in the memory-module handler. The test program is executed by the microprocessor on the target-system motherboard.

A power control means is coupled to the handler adaptor board thorough a power cable. It disconnects power to the memory-module under test when the memory-module handler is moving another memory module to a test position. Thus power to the memory-module under test is disconnected when tests of the memory-module under test is completed.

DETAILED DESCRIPTION

The present invention relates to an improvement in memory-module testers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that the component side of the PC motherboard is too crowded for attaching a SIMM/DIMM handler. However, the inventor has realized that the back or solder-side of the PC motherboard is less crowded and provides unobstructed access. The PC motherboard can be modified to connect its memory bus to a handler.

Reverse attachment of the handler to the solder-side of the PC motherboard is accomplished using a handler adapter board. The SIMM socket on the component side of the PC motherboard is removed, and the handler adapter board is plugged from the backside into the holes on the PC motherboard for the SIMM socket.

Figure 3:
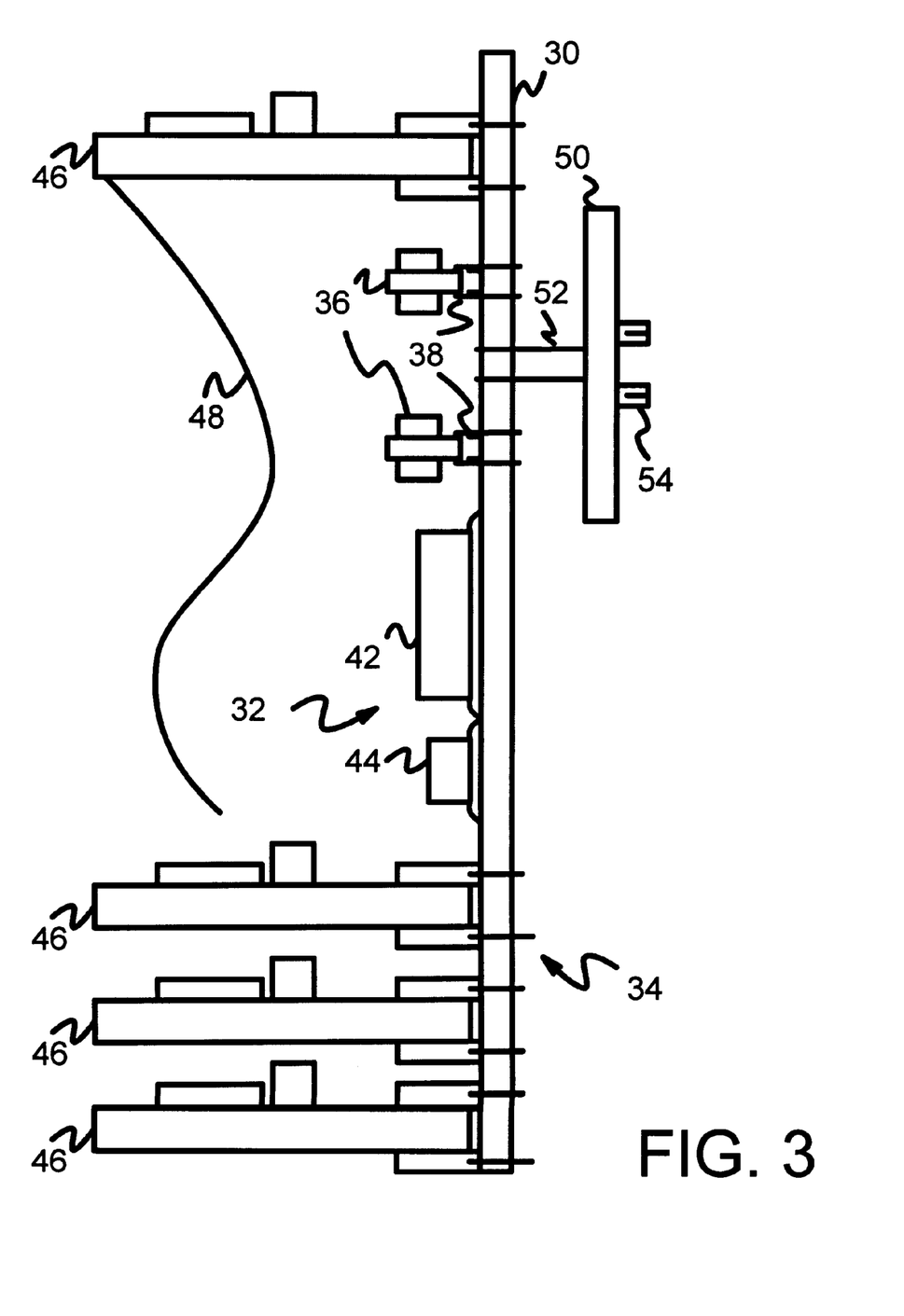
FIG. 3 illustrates an adapter board for a SIMM/DIMM handler mounted onto the solder-side of a PC motherboard using holes for a SIMM or DIMM socket

Handler Adaptor Board Reverse-Mounted to PC Motherboard—FIG. 3

FIG. 3 illustrates an adapter board for a SIMM/DIMM handler mounted onto the solder-side of a PC motherboard using holes for a SIMM or DIMM socket. Substrate 30 of the PC motherboard is a conventional multi-layer epoxy-fiberglass circuit board. Components 42, 44 are mounted on component-side 32 of substrate 30, by wave-soldering component leads to metal pads formed on the top metal layer of substrate 30. Some components may be mounted using pins that fit through holes in substrate 30. These pins then stick out to solder-side 34 of substrate 30, where they are wave-soldered to metal pads on solder-side 34. Other components may fit into sockets that are either surface or through-hole mounted to substrate 30. Typically a variety of components are mounted onto component-side 32 of substrate 30.

Memory modules 36 are SIMM or DIMM modules that fit into SIMM/DIMM sockets 38. SIMM/DIMM sockets 38 (hereinafter SIMM sockets 38) have metal pins that fit through holes in substrate 30. These pins are soldered to solder-side 34 of substrate 30 to rigidly attach SIMM sockets to the PC motherboard. Both electrical connection and mechanical support are provided by SIMM sockets 38.

Expansion cards 46 are plugged into expansion sockets that are also mounted onto component-side 32 of substrate 30. Pins from these sockets are fitted into through-holes in substrate 30 and soldered to solder-side 34 of substrate 30. All pins on all sockets and components are simultaneously soldered using wave-soldering or reflow techniques.

Cables 48 that are plugged into expansion cards 46 connect peripherals such as disk drives, video display monitors, and multimedia devices to the PC. Cables 48 and expansion cards 46 obstruct access to memory modules 36.

Handler adapter board 50 is a small epoxy-glass circuit board designed to interface a SIMM/DIMM handler to a PC motherboard. Connectors 54 on one surface of handler adapter board 50 mate with connectors on the back of the SIMM/DIMM handler. These connectors on the handler are for interfacing with an electronic tester and are typically the edge-connector type. The other surface of handler adaptor board 50 has adapter pins 52 protruding through. These adaptor pins are soldered into through-holes in handler adaptor board 50. Adapter pins 52 are arranged to have the same arrangement and spacings as the substrate-mounting pins for SIMM sockets 38.

SIMM Socket Removed

One or more of SIMM sockets 38 has been carefully removed from the PC motherboard. A soldering iron can be used to heat the pins of a SIMM socket protruding through to solder-side 34, allowing the solder to be removed. One the solder has been removed for all pins on a SIMM socket, the SIMM socket can be lifted off the motherboard, leaving the through-holes.

Adapter pins 52 are then fitted through the exposed through holes for the removed SIMM socket. Rather than push the pins through from component-side 32, adapter pins 52 are pushed through from solder-side 34 to component-side 32. Adapter pins 52 can then be soldered to substrate 30 by carefully soldering them to the metal pads on solder-side 34.

Handler adaptor board 50 provides electrical connection from the module-under-test (MUT) in the handler to the removed SIMM socket on the PC motherboard. Handler adaptor board 50 provides a slight spacing or offset from the solder-side 34 surface of substrate 30, allowing the handler to be plugged directly into connectors 54 on handler adaptor board 50. Since the offset of adaptor board 50 is slight, the length of electrical connections to the handler is short, minimizing added loading on the PC's memory bus. The relatively flat surface of solder-side 34 allows close mounting of the SIMM/DIMM handler to the PC motherboard. Removing one or more of the SIMM sockets on the motherboard provides mounting holes for handler adaptor board 50, eliminating the need to drill more mounting holes into substrate 30. Removing SIMM sockets also reduces capacitive loading on the PC's memory bus.

Figure 4:
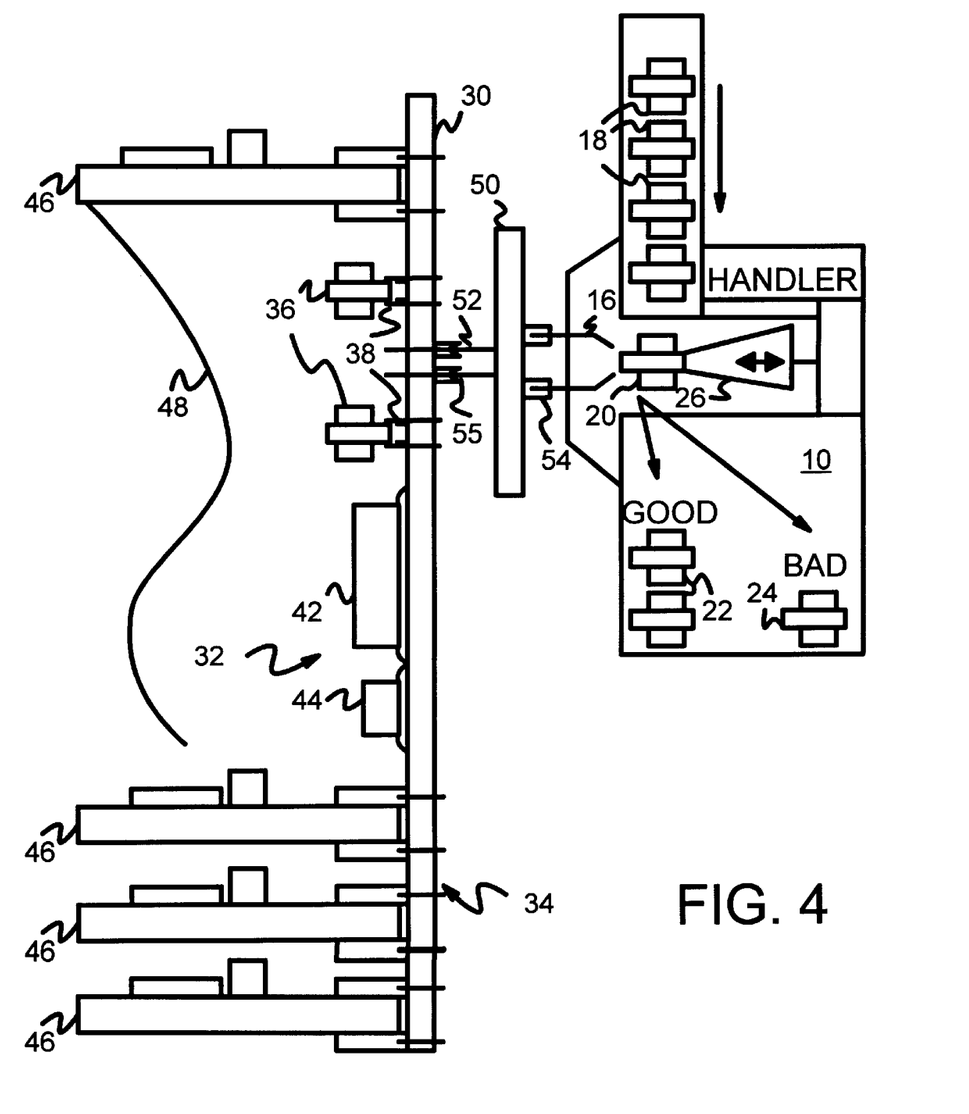
FIG. 4 shows that the SIMM/DIMM handler is mounted close to the backside of the PC motherboard using the handler adaptor board.

Handler Mounted Close to PC Motherboard—FIG. 4

FIG. 4 shows that the SIMM/DIMM handler is mounted close to the backside of the PC motherboard using the handler adaptor board. Handler 10 is not drawn to scale since it is several times larger than a PC motherboard. However, FIG. 4 does highlight how handler 10 can fit close to the removed SIMM socket. Such close mounting reduces loading and facilitates high-speed testing.

Contactor pins 16 within handler 10 clamp down onto leadless pads on the edge of module-under-test MUT 20 when arm 26 pushes MUT 20 into place for testing Contactor pins 16 include enough pins for all I/O leads on MUT 20, which is 168 for 168-pin DIMMs, or 72 for 72-pin SIMMs. Power and ground leads are also contacted by contactor pins 16.

Contactor pins 16 are electrically connected to connectors on the backside of handler 10. These connectors are edge-type connectors that normally connect with high-speed testers. Typically two connectors are provided. These male-type connectors fit into female-type connectors 54 mounted on handler adaptor board 50. Handler adaptor board 50 contains metal wiring traces formed therein that route signals from connectors 54 to adaptor pins 52 that protrude out the other side of handler adaptor board 50.

Adaptor pins 52 can be directly soldered to PC motherboard substrate 30 using the holes exposed when the SIMM socket was removed, as was shown in FIG. 3. Alternately, as shown in FIG. 4, adaptor pins 52 can be plugged into female pins 55 that are soldered onto solder-side 34 of the PC motherboard. Female pins 55 have extensions that fit into the through-holes exposed by removal of the SIMM socket, but also have cup-like receptacles for receiving adaptor pins 52. Using female pins 55 allows handler adaptor board 50 to be easily removed from substrate 30.

Once MUT 20 has been tested by a test program running on the PC motherboard, MUT 20 is sorted and drops down into either good bin 22 or bad bin 24. Sorting is in response to a pass/fail signal from the test program running on the PC motherboard.

Figure 5:
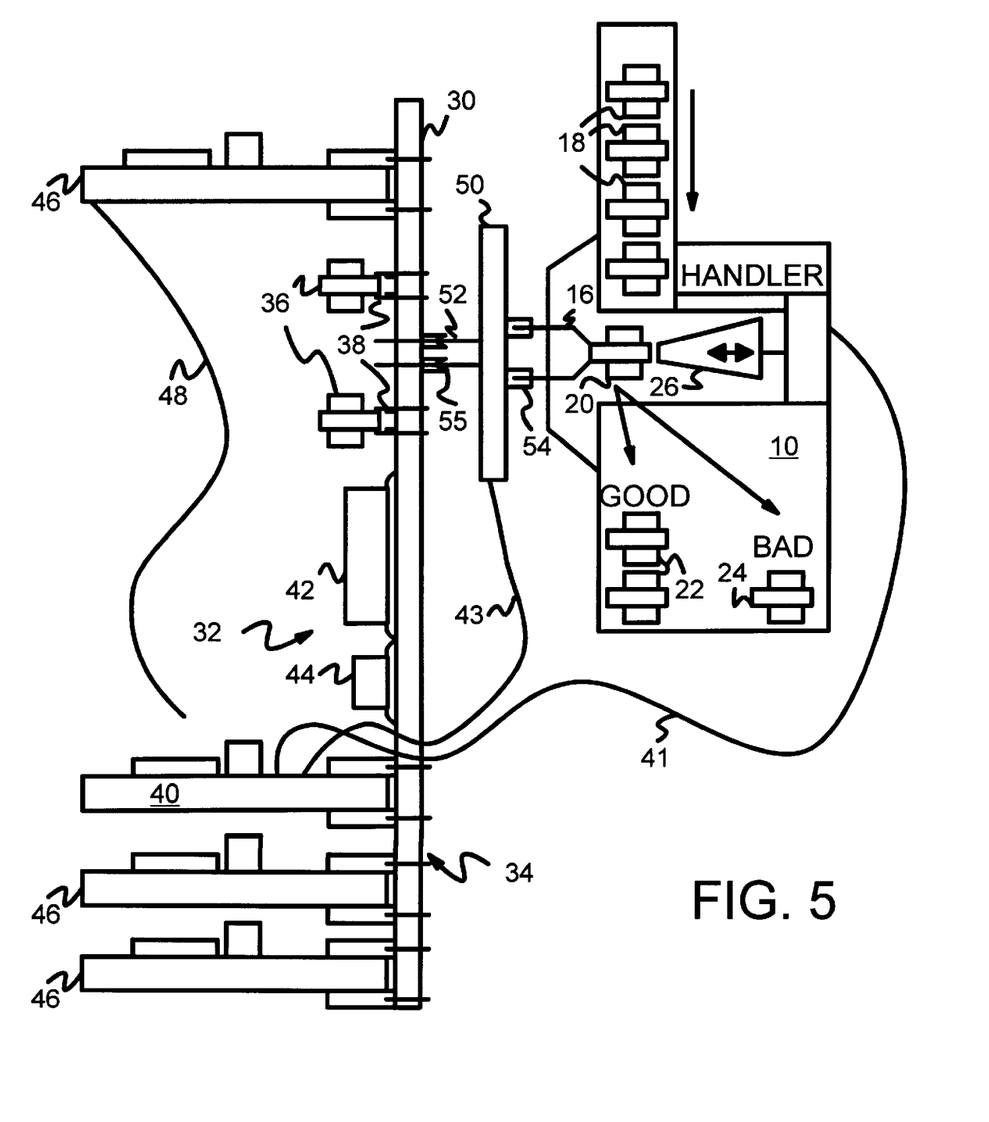
FIG. 5 shows a handler controller card that controls the handler attached to the PC motherboard through the handler adaptor board.

Handler Controller Card on PC Expansion Bus—FIG. 5

FIG. 5 shows a handler controller card that controls the handler attached to the PC motherboard through the handler adaptor board. The CP motherboard contains a number of expansion boards, using industry-standard expansion busses such as the AT/ISA bus, PCI bus, or EISA bus. One of the expansion sockets is fitted with handler controller card 40. Handler controller card 40 communicates with the test program executing on the microprocessor that is one of the components 42, 44 mounted on component-side 32 of PC motherboard substrate 30.

Handler controller card 40 receives a pass/fail signal from the test program. Such a pass/fail signal can be a status bit written to a register on handler controller card 40 by an I/O instruction that is executed at the end of the test program, or an interrupt generated by the test program.

When handler controller card 40 receives the pass/fail signal, it drives a pass/fail signal to handler 10 through cable 41. Cable 41 plugs into handler controller card 40 and into an I/O port on handler 10. The pass/fail indication from cable 41 causes handler 41 to retract arm 26 and move MUT 20 into either good bin 22 or bad bin 24. These tested modules can be removed by the test operator before the bins fill up.

When contactor pins 16 clamp down on a new MUT 20, electrical contact is made with the new memory module. This changes the loading on the memory bus and can cause glitches on the PC's memory bus. It is preferable to isolate the PC's memory bus from contactor pins 16 when contact is being made or broken to minimize bus upset.

Handler controller card 40 causes handler adaptor board 50 to electrically isolate contactor pins 16 from adaptor pins 52 when a new MUT 20 is being moved into place. Cable 43 sends a control signal from handler controller card 40 to handler adaptor board 50. In a preferred embodiment, this control signal simply disconnects power from the PC motherboard to MUT 20. Cable 43 provides an isolated power supply to handler adaptor board 50 and MUT 20.

Some of SIMM sockets 38 are left intact on the PC motherboard, allowing memory modules 36 to remain plugged into the PC. These memory modules 36 form a base memory that is used to boot the PC. Thus the PC motherboard can be booted up even when a bad memory module is being tested.

Figure 6:
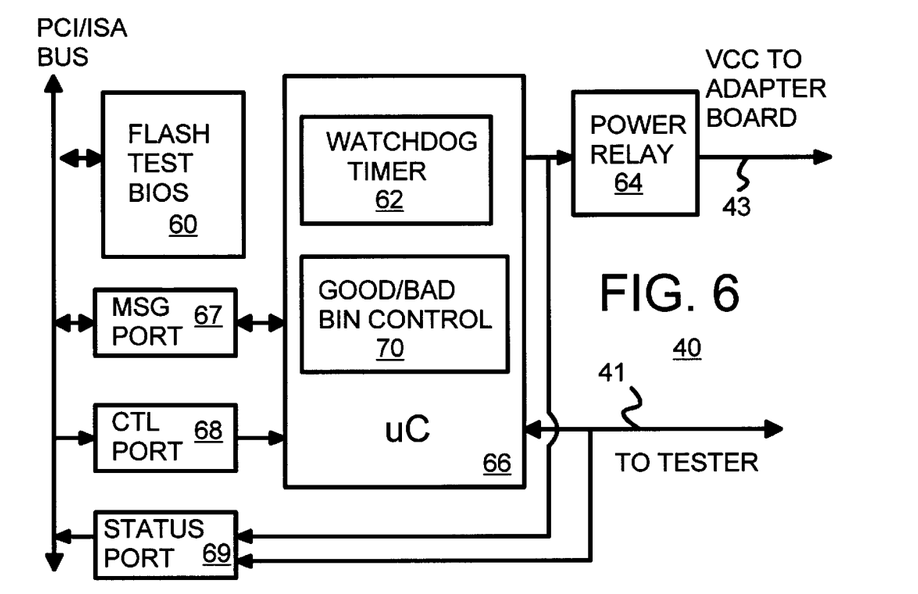
FIG. 6 is a simplified block diagram of a handler controller card on the expansion bus of the PC motherboard.

Handler Controller Card—FIG. 6

FIG. 6 is a simplified block diagram of a handler controller card on the expansion bus of the PC motherboard. Handler controller card 40 communicates with a test program executing on the PC's microprocessor over the expansion bus (AT/ISA, PCI, etc.) using message, control, and status ports 67, 68, 69. The test program itself can be transferred from flash BIOS 60 on handler controller card 40 to the main memory read by the microprocessor using the expansion bus.

During testing, power relay 64 disconnects the power supply (Vcc) to the module under test when the tester is moving a new module into position and clamping the contactor pins down onto the modules pads. Power relay 64 disconnects power over cable 43 when the test sequence has finished and the pass/fail signal is received. Power relay 64 then reconnects power when the handler sends a READY signal over cable 41 to handler controller card 40. This READY signal is generated by the handler when a new module has been moved into position for testing.

Microcontroller 66 executes a small program that listens for the READY signal and the pass/fail signal. This small program is stored in local memory in microcontroller 66. Microcontroller 66 also controls power relay 64, and executes bin control program 70 to generate the good/bad bin signal that is sent to the handler over cable 41.

Watchdog timer program 62 executed by microcontroller 66 is used to signal a bad lo module when the test program hangs. Watchdog timer program 62 is reset when a new module begins testing and signals a timeout after 2 minutes without receiving the pass/fail signal from the microprocessor. Microcontroller 66 also checks for the timeout from watchdog timer program 62 and then executes bin control program 70 to generate a fail signal.

Figure 7:
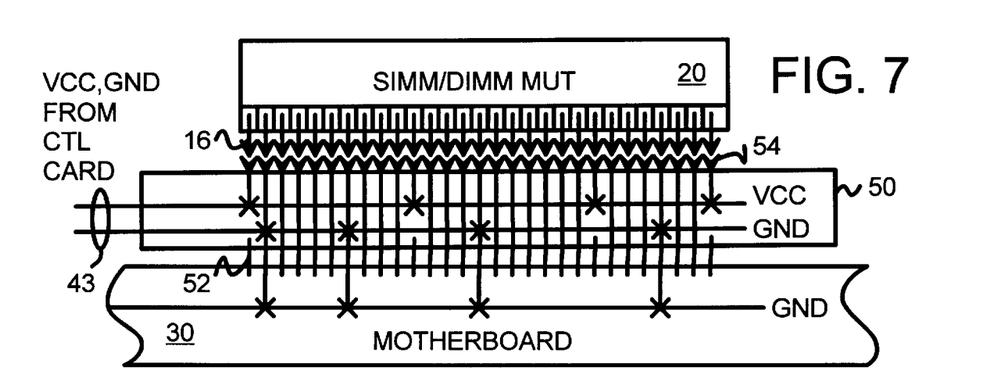
FIG. 7 shows that power is disconnected from the PC motherboard to the device under test.

Vcc Disconnected at Handler Adaptor Board—FIG. 7

FIG. 7 shows that power is disconnected from the PC motherboard to the device under test. This helps to isolate the power supply near the memory bus from the handler.

Module-under test MUT 20 is in the handler (not shown). Contactor pins 16 have clamped down onto the leadless pads on the edge of module 20. These contactor pins are plugged into connector 54 on handler adaptor board 50. Most I/O signals from module 20 are passed through to the PC motherboard substrate 30, through adaptor pins 52. These passed-thorough signals include the data input/output signals, control signals such as RAS, CAS, WE, and address bits.

However, power traces are not passed through. Instead, all power-supply Vcc pins from module 20 are connected to the power supplied over cable 43 from the handler controller card. Power-supply connections to adaptor pins 52 are not connected to any other signals on handler adaptor board 50. Instead, power from PC motherboard substrate 30 are left floating within handler adaptor board 50.

Ground lines are connected through handler adaptor board 50 to module 20. Also, the ground from cable 43 is connected to the PC motherboard ground through adaptor pins 52. Thus while the power supplies are isolated, the grounds are connected together.

Figure 8:
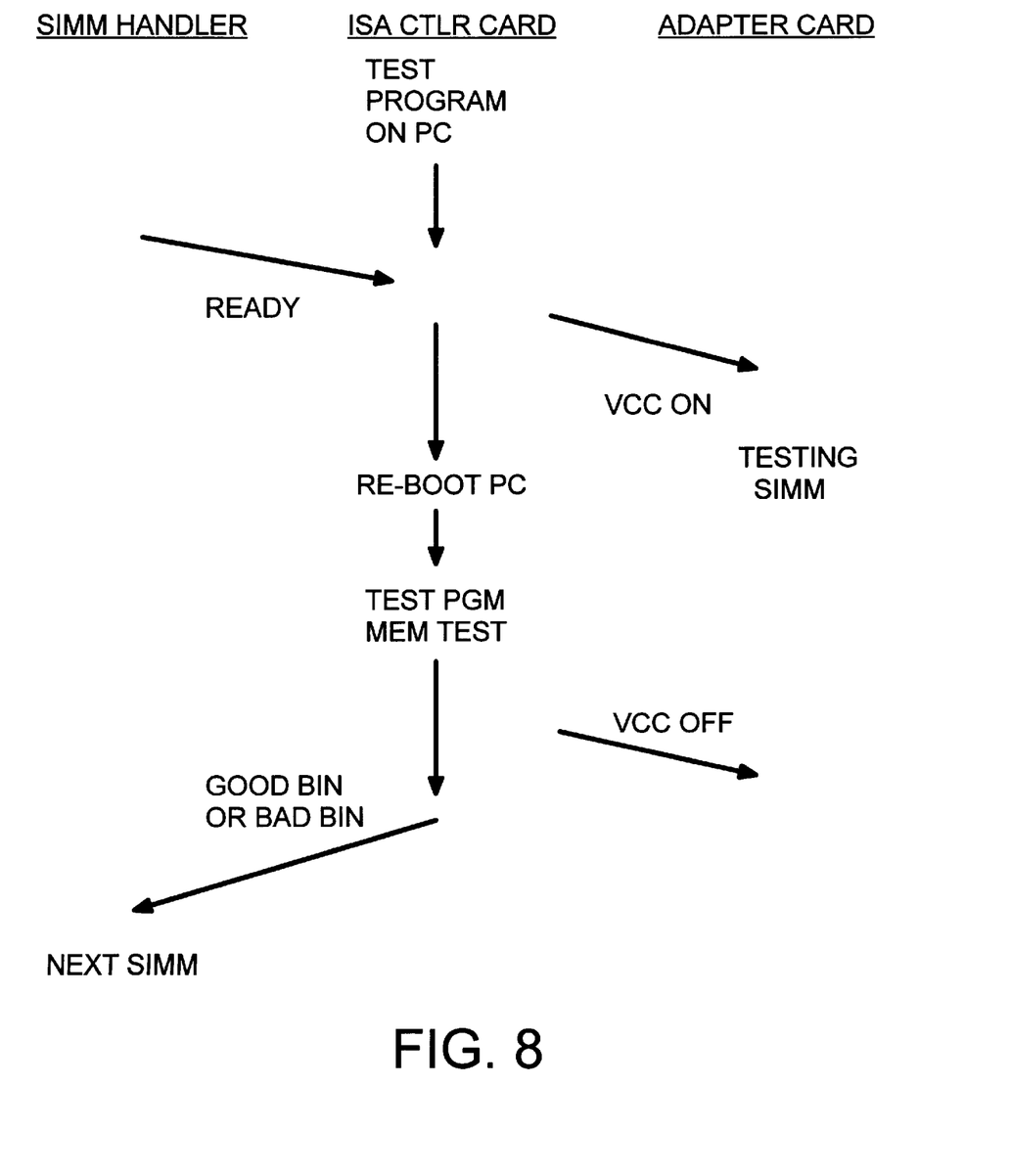
FIG. 8 shows the test flow using the SIMM/DIMM handler connected to the PC motherboard.

Test Flow—FIG. 8

FIG. 8 shows the test flow using the SIMM/DIMM handler connected to the PC motherboard. The test operator begins the test program by typing in a command on the keyboard attached to the PC motherboard, or by selecting the command with a mouse attached to the motherboard. A video monitor is also connected to one of the expansion cards on the motherboard.

The test operation then loads a stack of memory modules for testing into the top of the handler. The microcontroller on the handler controller card waits for the READY signal from the handler. This READY signal is generated when the bottom module in the input stack is loaded into test position and the contactor pins are clamped don on the module.

Once the READY is received, the microcontroller on the handler controller card activates the power relay, which sends power to the handler adaptor card. This causes the module under test in the handler to be powered up. The handler adaptor card then signals the test program running on the PC, and a software instruction is executed that reboots the PC.

During the reboot sequence, the memory is tested using a simple test. Both the base memory in the SIMMs remaining on the motherboard, and the memory in the module in the handler are tested by the memory-sizing test in the reboot sequence. If the handler's memory module is faulty, the remaining memory modules on the motherboard form a base memory with sufficient capacity to boot up the PC.

The memory-sizing test in the reboot sequence in not comprehensive enough for production testing. Thus, once the PC is booted up, additional test vectors are written to and read from the memory module in the handler. If any failures are detected, then the text program signals a fail to the handler controller card. Otherwise, if all tests pass, a pass is signaled. The handler controller card then disconnects power to the handler adaptor board and signals pass or fail to the handler. The handler then sorts the module tested into either the good or bad bin and moves the next module into the test position. The sequence of FIG. 8 is then repeated for the next module.

Figure 9:
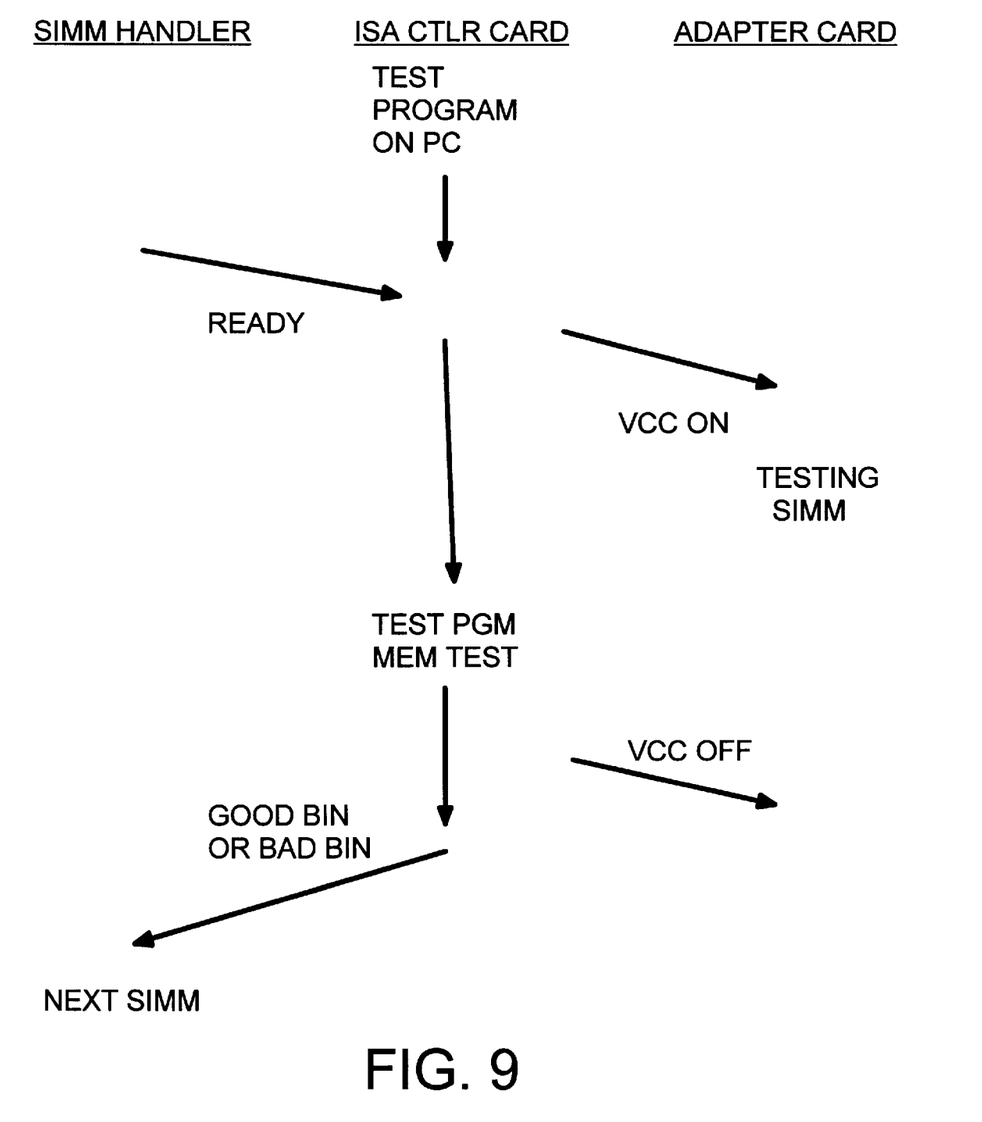
FIG. 9 is a modified test flow that does not reboot the PC.

Test Flow Without ReBoot—FIG. 9

FIG. 9 is a modified test flow that does not reboot the PC. Rebooting the PC is a relatively slow process that increases test time. The memory sizing tests in the reboot sequence are rather crude compared with the more comprehensive tests vectors in the test program. When the READY is received from the handler, the handler controller card applies power to the module in the handler and then waits for a predetermined delay for the module to be powered up.

After this delay, the test program is signaled to begin a new test sequence. The test program then begins writing and reading from the additional memory, the memory module in the handler. The PC is not rebooted. Should a failure occur, the test program signals the handler controller card and the handler advances to the next module.

Sometimes a failure in the module can hang the PC. In this case the watchdog timer on the handler controller card generates the timeout, and a reset is generated from the flash BIOS and microcontroller on the handler controller card. Should this fail, the operator must manually reboot the PC.

Figure 10:
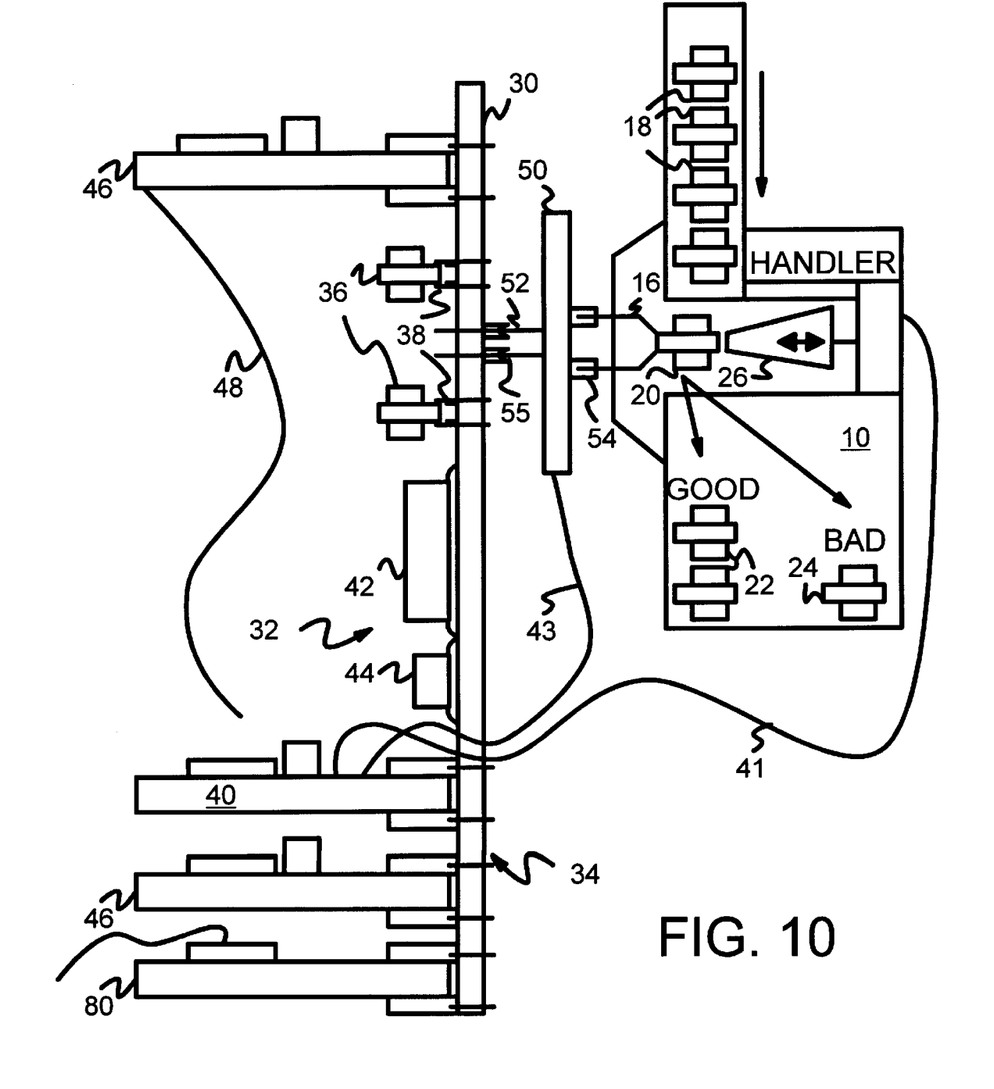
FIG. 10 shows an alternate embodiment that uses a LAN card to collect test statistics.

LAN Card on Modified PC Motherboard—FIG. 10

FIG. 10 shows an alternate embodiment that uses a LAN card to collect test statistics. A local-area-network LAN card 80 is installed in an expansion slot on substrate 30 on the PC motherboard. As the test program is executing, it also sends a pass/fail signal to LAN card 80, for transmission over a network to a central server. Many such PC motherboard with attached handlers are networked together in such a fashion. The central server receives pass/fail signals from all testing stations and keeps track of statistics, such as the total passed and failed modules, test time, etc.

ADVANTAGES OF THE INVENTION

A low-cost test apparatus has been disclosed for testing memory modules. Testing costs are reduced by eliminating the expensive electronic tester. A PC motherboard or other target-system board is used to test the memory modules. A SIMM/DIMM handler automatically inserts and removes memory modules that are tested by the PC motherboard. The handler is connected to the PC motherboard without a long cable so that the loading on the PC's memory bus is minimized, allowing full-speed testing. The low profile of the adapter card to the motherboard allows the handler to be placed close to the motherboard.

The handler adaptor board provides electrical connection from the module-under-test (MUT) in the handler to the removed SIMM socket on the PC motherboard. The handler adaptor board provides a slight spacing or offset from the solder-side surface of the PC motherboard's substrate, allowing the handler to be plugged directly into tester-connectors on the handler adaptor board. Since the offset of the adaptor board is slight, the length of electrical connections to the handler is short, minimizing added loading on the PC's memory bus.

The relatively flat surface of the solder-side of the PC motherboard allows close mounting of the SIMM/DIMM handler to the PC motherboard. Removing one or more of the SIMM sockets on the motherboard provides mounting holes for the handler adaptor board, eliminating the need to drill more mounting holes into the PC motherboard substrate. Removing SIMM sockets also reduces capacitive loading on the PC's memory bus.

Some of the SIMM sockets are left intact on the PC motherboard, allowing memory modules to remain plugged into the PC. These remaining memory modules form a base memory that is used to boot the PC. Thus the PC motherboard can be booted up even when a bad memory module is being tested.

ALTERNATE EMBODIMENTS

Several other embodiments are contemplated by the inventors. For example, many kinds of memory modules can be tested. Modules using standard DRAM or newer EDO and synchronous DRAM can be tested. Other memories such as RAMBUS modules can be tested. Various sizes of memory in the memory module, and form factors for memory modules can be used with the invention, limited by the handler. Non-PC motherboards can also be substituted. The invention can be applied to any target system board.

The handler controller card on the ISA or PCI bus can be adapted for other buses and is not limited to existing buses. The handler controller card can be replaced by a standard parallel or serial-port interface to the handler. FireWire and other emerging standards can be used for the interfaces.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An automated test apparatus for testing high-speed memory modules using a memory-module handler, the automated test apparatus comprising:

a target-system motherboard having components including a microprocessor, memory, and expansion-bus connectors mounted on a component-side of the target-system motherboard, the memory including memory modules inserted into memory-module sockets mounted on the component-side;

a handler adaptor board having adaptor pins protruding out a first side and having connector sockets mounted on a second side opposite the first side, wherein at least one of the memory-module sockets has been removed;

wherein the adaptor pins connect to the target-system motherboard on a solder-side of the target-system motherboard immediately opposite a location where the at least one memory-module sockets have been removed; and wherein the connector sockets on the handler adaptor board are for connecting to the memory-module handler, for connecting signals from a memory module under test in the memory-module handler to a memory bus on the target-system motherboard, whereby the memory module under test in the memory-module handler is electrically connected to the target-system motherboard.

2. The automated test apparatus of claim 1 further comprising:

a handler controller card, inserted into one of the expansion-bus connectors, the handler controller card for communicating with the memory-module handler when the memory-module under test in the memory-module handler is being tested by the target-system motherboard, whereby the memory-module handler is controlled by the target-system motherboard.

3. The automated test apparatus of claim 2 wherein the handler controller card further comprises:

power control means, coupled to the handler adaptor board thorough a power cable, for disconnecting power to the memory-module under test when the memory-module handler is moving another memory module to a test position, whereby power to the memory-module under test is disconnected when testing of the memory-module under test is completed.

4. The automated test apparatus of claim 3 wherein the handler controller card further comprises:

sorting means, coupled to the memory-module handler through a handler cable, for sending a sort signal to the memory-module handler at a completion of testing of the memory-module under test, the sort signal for instructing the memory-module handler to sort the memory-module under test into either a good bin or functional memory modules or into a bad bin of faulty memory modules.

5. The automated test apparatus of claim 4 wherein the handler cable further includes a ready signal from the memory-module handler, the ready signal indicating when the memory-module handler has moved a new memory-module to a test position.

6. The automated test apparatus of claim 4 wherein the handler controller card further comprises:

flash memory means for storing a test program, the test program for testing the memory-module under test in the memory-module handler, the test program executed by the microprocessor on the target-system motherboard.

7. The automated test apparatus of claim 6 wherein the handler controller card further comprises:

microcontroller means, coupled to the flash memory means, for executing a portion of the test program.

8. The automated test apparatus of claim 7 wherein the handler controller card further comprises:

watchdog timer means, coupled to the microcontroller means, for generating a timeout signal when the target-system motherboard has stopped responding;

reset means, in the microcontroller means for generating a system reset to the target-system motherboard in response to the timeout signal, wherein the handler controller card resets the target-system motherboard when it crashes.

9. The automated test apparatus of claim 8 wherein the handler adaptor board connects all signals from the memory-module under test to the target-system motherboard except for power signals, wherein power signals to the memory-module under test are supplied from the handler controller card through the power cable.

10. The automated test apparatus of claim 1 wherein the memory-module sockets include mounting pins, the mounting pins fitting through holes in the target-system motherboard, the memory-module sockets mechanically and electrically connected to the target-system motherboard by solder on the mounting pins and holes on the solder-side, and wherein the adaptor pins fit through the holes for the at least one memory-module socket that was removed, the adaptor pins soldered to the solder-side of the target-system motherboard.

11. The automated test apparatus of claim 1 wherein the memory-module sockets include mounting pins, the mounting pins fitting through holes in the target-system motherboard, the memory-module sockets mechanically and electrically connected to the target-system motherboard by solder on the mounting pins and holes on the solder-side; and further comprising:

female pins on the target-system motherboard, the female pins mounted through the holes for the at least one memory-module socket that was removed, the female pins soldered to the solder-side of the target-system motherboard, wherein the adaptor pins fit into the female pins when the handler adaptor board is connected to the target-system motherboard.

12. The automated test apparatus of claim 1 wherein the target-system motherboard is a personal computer PC motherboard and wherein the expansion-bus connectors are either ISA-bus connectors or PCI-bus connectors.

13. The automated test apparatus of claim 1 wherein the memory modules are single-inline memory module SIMMs or dual-inline memory module DIMMs or RAMBUS modules.

14. A method for testing memory modules comprising the steps of:

connecting a handler adaptor board to a motherboard by removing a memory-module socket from the motherboard and inserting adaptor pins on the handler adaptor board into holes in the motherboard exposed by removal of the memory-module socket;

connecting a memory-module handler to the handler adaptor board;

loading the memory-module handler with an input stack of memory modules to be tested;

activating a test program and executing the test program on a microprocessor on the motherboard;

waiting for a ready signal from the memory-module handler when a memory module from the input stack is moved into a test position and electrically connected to the handler adaptor board;

activating power to the handler adaptor board and to the memory module in the test position in the memory-module handler when the ready signal is received;

writing and reading test vectors from the microprocessor through the handler adaptor board to memory locations in the memory module under test;

determining when all of the memory locations are functional;

disconnecting power to the handler adaptor board and to the memory module in the test position once all test vectors have been written and read;

sending a sort signal to the memory-module handler;

in response to the sort signal, the memory-module handler sorting the memory module in the test position to a good bin when all of the memory locations were determined to be functional but sorting the memory module in the test position to a bad bin when not all of the memory locations were determined to be functional; and the memory-module handler moving a next memory module from the input stack to the test position and generating the ready signal, whereby memory modules are tested automatically by the motherboard using the memory-module handler to connect new memory modules to the motherboard.

15. The method of claim 14 further comprising the step of:

generating a reset signal to the microprocessor when the ready signal is received from the memory-module handler; and rebooting the motherboard using memory on the motherboard as base memory for rebooting the motherboard;

whereby the motherboard is rebooted for each new memory module tested.

16. The method of claim 14 wherein the handler adaptor board is located on an opposite side of the motherboard from the memory-module socket that was removed.

17. The method of claim 16 wherein the memory-module handler is directly connected to the handler adaptor board by plugging connectors together without using a flexible cable.

18. The method of claim 14 further comprising the step of:

sending results of testing the memory module to a central server using a local-area-network card installed in an expansion-bus socket on the motherboard.

19. A memory-module tester comprising:

a memory-module handler, having a input stack of untested memory modules, a test position for a memory module under test, a good bin containing tested functional memory modules and a bad bin containing tested non-functional memory modules, the memory-module handler having contactors that make contact with electrical pads on the memory module under test and a connector that is electrically connected with the contactors;

a motherboard having a microprocessor, expansion-bus sockets, and memory-module sockets mounted on a component side, the motherboard having holes for a missing memory-module socket, the holes between the component side and a solder side opposite the component side;

a handler adaptor board having adaptor pins on one side and a handler connector on an opposite side, the handler adaptor board electrically connecting adaptor pins to the handler connector;

wherein the adaptor pins connect the handler adaptor board to the motherboard using the holes for the missing memory-module socket;

wherein the handler connector connects the handler adaptor board to the connector on the memory-module handler; and a test program executing on the microprocessor on the motherboard, the test program for writing and reading back test patterns to the memory module under test in the memory-module handler, the test program instructing the memory-module handler to drop the memory-module under test into either the good bin or the bad bin and to move a next memory module from the input stack to the test position, whereby memory modules are automatically tested by the motherboard using the memory-module handler to move memory modules into the test position.

20. The memory-module tester of claim 19 further comprising:

a handler controller card inserted into one of the expansion-bus sockets on the motherboard, the handler controller card coupled to the memory-module handler by a handler cable.

\* \* \* \* \*